United States Patent
Ideguchi et al.

(10) Patent No.: US 10,619,948 B2
(45) Date of Patent: Apr. 14, 2020

(54) HEAT RADIATING PLATE WITH SUPPORTING MEMBERS AND PROTRUSION MEMBERS

(71) Applicant: DOWA METALTECH CO., LTD., Tokyo (JP)

(72) Inventors: Satoru Ideguchi, Nagano (JP); Hideyo Osanai, Nagano (JP); Hirotaka Kotani, Nagano (JP)

(73) Assignee: DOWA METALTECH CO., LTD., Tokyo (JP)

( * ) Notice: Subject to any disclaimer, the term of this patent is extended or adjusted under 35 U.S.C. 154(b) by 511 days.

(21) Appl. No.: 14/036,551

(22) Filed: Sep. 25, 2013

(65) Prior Publication Data

US 2014/0083671 A1 Mar. 27, 2014

(30) Foreign Application Priority Data

Sep. 27, 2012 (JP) .................................. 2012-213365
Aug. 29, 2013 (JP) .................................. 2013-177749

(51) Int. Cl.
*H01L 23/367* (2006.01)
*F28F 21/08* (2006.01)
(Continued)

(52) U.S. Cl.
CPC .......... *F28F 21/08* (2013.01); *H01L 21/4871* (2013.01); *H01L 21/4882* (2013.01);
(Continued)

(58) Field of Classification Search
CPC ......... H05K 7/202039; H05K 7/20409; H05K 7/20436; H05K 7/20472; H05K 7/20;
(Continued)

(56) References Cited

U.S. PATENT DOCUMENTS 3,284,193 A * 11/1966 Anderson ............... C22C 21/10
                                                        420/532
3,399,332 A *  8/1968 Savolainen ............. H01L 23/36
                                                        257/712
(Continued)

FOREIGN PATENT DOCUMENTS

JP         4-363052 A      12/1992
JP      2006066595 A  *    3/2006
(Continued)

OTHER PUBLICATIONS

Solar Atmospheres Inc.; Critical Melting Points and Reference Data for Vacuum Heat Treating; Edited by: Virginia Osterman, Ph.D. , Harry Antes Jr., Ph.D., Technical Consultants Sep. 2010.*

(Continued)

*Primary Examiner* — Gordon A Jones
(74) *Attorney, Agent, or Firm* — Bachman & LaPointe, PC

(57) ABSTRACT

A heat radiating plate 10 of a metal material includes a flat plate portion 10a, a large number of columnar protruding portions 10b which protrude from one major surface of the flat plate portion and which are integrated with the flat plate portion, and a reinforcing plate member 12 of a material, which has a higher melting point than that of the flat plate portion and columnar protruding portions and which is arranged in a region, which is arranged in the flat plate portion and which is close to one major surface of the flat plate portion, the reinforcing member passing through the flat plate portion to extend in directions substantially parallel to the one major surface of the flat plate portion and having end faces exposed to the outside, the whole surface of the reinforcing member except for the end faces being bonded directly to the flat plate portion.

8 Claims, 11 Drawing Sheets

(51) Int. Cl.
*H01L 21/48* (2006.01)
*H01L 23/373* (2006.01)

(52) U.S. Cl.
CPC ........ *H01L 23/367* (2013.01); *H01L 23/3677* (2013.01); *H01L 23/3672* (2013.01); *H01L 23/3733* (2013.01); *H01L 23/3735* (2013.01); *H01L 2924/0002* (2013.01)

(58) Field of Classification Search
CPC .............. H05K 7/2039; H01L 21/4882; H01L 21/4871; H01L 23/367; H01L 23/3677; H01L 23/3735
USPC .......................................... 165/185; 257/712
See application file for complete search history.

(56) References Cited

U.S. PATENT DOCUMENTS

| | | | | |
|---|---|---|---|---|
| 3,683,828 | A | * | 8/1972 | Alliegro ................ F41H 5/0414 109/83 |
| 3,970,136 | A | * | 7/1976 | Cannell .................. B22D 19/14 164/108 |
| 5,151,777 | A | * | 9/1992 | Akin ................... H01L 23/3735 257/712 |
| 5,965,193 | A | | 10/1999 | Ning et al. |
| 7,097,914 | B2 | * | 8/2006 | Tanaka ................... B23K 20/04 156/60 |
| 7,521,789 | B1 | | 4/2009 | Rinehart et al. |
| 7,745,262 | B2 | * | 6/2010 | Huang ................ H01L 21/4871 257/706 |
| 7,956,446 | B2 | * | 6/2011 | Heinrich ................ H01L 24/40 257/666 |
| 2004/0118579 | A1 | * | 6/2004 | McCutcheon ...... F28D 15/0241 174/16.3 |
| 2007/0227697 | A1 | | 10/2007 | Takahashi |
| 2008/0277104 | A1 | | 11/2008 | Aoki et al. |
| 2012/0140420 | A1 | | 6/2012 | Soyano et al. |
| 2013/0200510 | A1 | * | 8/2013 | Soyano ............... H01L 23/3677 257/712 |
| 2015/0338176 | A1 | * | 11/2015 | Chen ..................... F28F 21/084 165/185 |

FOREIGN PATENT DOCUMENTS

| | | | | |
|---|---|---|---|---|
| JP | 2007294891 | A | | 11/2007 |
| JP | 11-68359 | A | | 3/2009 |
| JP | WO 2012056809 | A1 | * 5/2012 | ......... H01L 23/3677 |
| WO | 2008123172 | A1 | | 10/2008 |
| WO | WO-2008123172 | A1 | * 10/2008 | ............. B22D 19/00 |

OTHER PUBLICATIONS

Minoru JP 11-068359A machine translation.*
WO 2008/123172 A1 machine translation (Year: 2008).*
JP 2006-066595 A MT (Year: 2006).*
European Search Report dated Oct. 4, 2017 for European Patent Application No. 13185984.5.

* cited by examiner

HEAT RADIATING PLATE WITH SUPPORTING MEMBERS AND PROTRUSION MEMBERS

BACKGROUND OF THE INVENTION

Field of the Invention

The present invention generally relates to a heat radiating plate and a method for producing the same. More specifically, the invention relates to a heat radiating plate integrated with radiating fins, and a method for producing the same.

Description of the Prior Art

In a conventional metal/ceramic bonding substrate used as an insulating substrate for power modules, a metal circuit plate is bonded to one side of a ceramic substrate, and a metal base plate for heat radiation is bonded to the other side thereof, the metal circuit plate mounting thereon semiconductor chips and so forth.

In order to radiate heat from heating elements, such as semiconductor chips, to the outside, there is known a method for mounting radiating fins on the reverse of a metal base plate for heat radiation via radiating grease. There is also known a method for bonding radiating fins to a semiconductor device mounting substrate via a brazing filler metal (see, e.g., Japanese Patent Laid-Open No. 4-363052).

In order to further improve the cooling power of a metal/ceramic bonding substrate, there is proposed a heat radiator which has a member integrated with a large number of columnar (or pillar) protruding portions (as radiating fins), each of which has a shape of substantially circular truncated cone (see, e.g., Japanese Patent Laid-Open No. 2007-294891).

When a large number of columnar protruding portions having a shape of substantially circular truncated cone are formed as radiating fins like a heat radiator disclosed in Japanese Patent Laid-Open No. 2007-294891, if the protruding portions are formed by a method (so-called molten metal bonding method) for cooling and solidifying a molten metal (of aluminum, an aluminum alloy or the like) injected into a mold, a great thermal stress is produced during the cooling and solidifying of the molten metal by the great difference between the thermal expansion coefficient of the mold (of isotropic carbon or the like) and that of aluminum, the aluminum alloy or the like, so that it is very difficult to release the protruding portions from the mold if a large number of radiating fins having a small tapered angle (of not greater than 5°) are formed to increase the total surface area of the radiating fins. For that reason, there are problems in that it is not possible to obtain radiating fins having a desired shape due to the flaws and breaks thereof and/or that the mold is broken.

SUMMARY OF THE INVENTION

It is therefore an object of the present invention to eliminate the aforementioned problems and to provide a heat radiating plate, which can be easily released from a mold to form columnar (or pillar) protruding portions having a desired shape while preventing the break of the mold, even if the heat radiating plate produced by the mold has a flat plate portion integrated with a large number of protruding portions which protrude from one major surface of the flat plate portion, and a method for producing the same.

In order to accomplish the aforementioned and other objects, the inventors have diligently studied and found that it is possible to produce a heat radiating plate, which can be easily released from a mold to form columnar (or pillar) protruding portions having a desired shape while preventing the mold from being broken, even if the heat radiating plate produced by the mold has a flat plate portion integrated with a large number of protruding portions which protrude from one major surface of the flat plate portion, if a reinforcing member extending in directions substantially parallel to the one major surface of the flat plate portion is arranged in a region which is arranged in the flat plate portion and which is close to the one major surface of the flat plate portion, in the heat radiating plate which is made of a metal and which has the flat plate portion integrated with the large number of protruding portions which protrude from the one major surface of the flat plate portion. Thus, the inventors have made the present invention.

According to one aspect of the present invention, there is provided a heat radiating plate which is made of a metal material and which comprises: a flat plate portion; a large number of columnar protruding portions which protrude from one major surface of the flat plate portion and which are integrated with the flat plate portion; and a reinforcing member which extends in directions substantially parallel to one major surface of the flat plate portion, the reinforcing member being arranged in a region which is arranged in the flat plate portion and which is close to the one major surface of the flat plate portion.

In this heat radiating plate, the reinforcing member preferably passes through the flat plate portion to extend therein, and the whole surface of a portion of the reinforcing member passing through the flat plate portion to extend therein is preferably bonded directly to the flat plate portion. The reinforcing member preferably has end faces which are exposed to the outside, and the whole surface of the reinforcing member except for the end faces is preferably bonded directly to the flat plate portion. The reinforcing member is preferably a plate member, and may be a plurality of plate members which are spaced from each other to extend. The reinforcing member is made of a material which has a higher melting point than that of the metal material of the flat plate portion and the columnar protruding portions. The metal material of the flat plate portion and the columnar protruding portion is preferably aluminum or an aluminum alloy. In this case, the reinforcing member is preferably made of a metal which contains iron and at least one selected from the group consisting of nickel, cobalt, copper and manganese. Alternatively, the reinforcing member may be made of at least one ceramic selected from the group consisting of alumina, aluminum nitride, silicon nitride and silicon carbide. Each of the large number of columnar protruding portions preferably has a shape of substantially cylindrical or circular truncated cone, and may have a shape of substantially rectangular column or flat plate. The region close to the one major surface of the flat plate portion is preferably a region which is apart from the one major surface of the flat plate portion by 0.1 to 1.0 mm. One major surface of a ceramic substrate may be bonded directly to the other major surface of the flat plate portion, and a metal plate may be bonded directly to the other major surface of the ceramic substrate.

According to another aspect of the present invention, there is provided a method for producing a heat radiating plate which is made of a metal material and which has a flat plate portion and a large number of columnar protruding portions protruding from one major surface of the flat plate portion and being integrated with the flat plate portion, the method comprising the steps of: allowing end portions of a reinforcing member of a material, which has a higher melting point than that of the flat plate portion and the columnar protruding portions, to be supported on a mold; injecting a molten metal of a metal material into the mold so that the molten metal contacts the whole surface of the reinforcing member except for end portions thereof in the mold; and then, cooling and solidifying the molten metal for forming the flat plate portion and the large number of columnar protruding portions, which protrude from the one major surface of the flat plate portion and which are integrated with the flat plate portion, and for allowing the reinforcing member, which extends substantially parallel to the one major surface of the flat plate portion, to be arranged in a region, which is arranged in the flat plate portion and which is close to the one major surface of the flat plate portion, while allowing the reinforcing member to be bonded directly to the flat plate portion.

According to a further aspect of the present invention, there is provided a method for producing a heat radiating plate which is made of a metal material and which has a flat plate portion and a large number of columnar protruding portions protruding from one major surface of the flat plate portion and being integrated with the flat plate portion, the other major surface of the flat plate portion being bonded directly to one major surface of a ceramic substrate, the method comprising the steps of: allowing end portions of the ceramic substrate and end portions of a reinforcing member of a material, which has a higher melting point than that of the flat plate portion and the columnar protruding portions, to be supported on a mold so that the ceramic substrate is apart from the reinforcing member in the mold; injecting a molten metal of a metal material into the mold so that the molten metal contacts both major surfaces of the substrate and the whole surface of the reinforcing member except for end portions thereof in the mold; and then, cooling and solidifying the molten metal for forming a metal plate to allow the metal plate to be bonded directly to the other major surface of the ceramic substrate, and for forming the flat plate portion and the large number of columnar protruding portions, which protrude from the one major surface of the flat plate portion and which are integrated with the flat plate portion, and for allowing the reinforcing member, which extends substantially parallel to the one major surface of the flat plate portion, to be arranged in a region, which is arranged in the flat plate portion and which is close to the one major surface of the flat plate portion, while allowing the reinforcing member to be bonded directly to the flat plate portion.

In these methods for producing a heat radiating plate, the reinforcing member preferably passes through the flat plate portion to extend therein, and the whole surface of a portion of the reinforcing member passing through the flat plate portion to extend therein is preferably bonded directly to the flat plate portion. The end portions of the reinforcing member protruding from the flat plate portion are preferably removed. The mold preferably comprises an upper mold member and a lower mold member, and the end portions of the reinforcing member are preferably clamped between the upper mold member and the lower mold member to be supported on the mold. The reinforcing member is preferably a plate member, and may be a plurality of plate members which are spaced from each other to extend. The molten metal is a molten metal of aluminum or an aluminum alloy. In this case, the reinforcing member is preferably made of a metal which contains iron and at least one selected from the group consisting of nickel, cobalt, copper and manganese. Alternatively, the reinforcing member may be made of at least one ceramic selected from the group consisting of alumina, aluminum nitride, silicon nitride and silicon carbide. Each of the large number of columnar protruding portions preferably has a shape of substantially cylindrical or circular truncated cone, and may have a shape of substantially rectangular column or flat plate. The region close to the one major surface of the flat plate portion is preferably a region which is apart from the one major surface of the flat plate portion by 0.1 to 1.0 mm.

According to the present invention, it is possible a heat radiating plate, which can be easily released from a mold to form columnar (or pillar) protruding portions having a desired shape while preventing the break of the mold, even if the heat radiating plate produced by the mold has a flat plate portion integrated with a large number of protruding portions which protrude from one major surface of the flat plate portion.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a heat radiating plate and a method for producing the same according to the present invention will be described below in detail.

[First Preferred Embodiment]

Figure 1A:
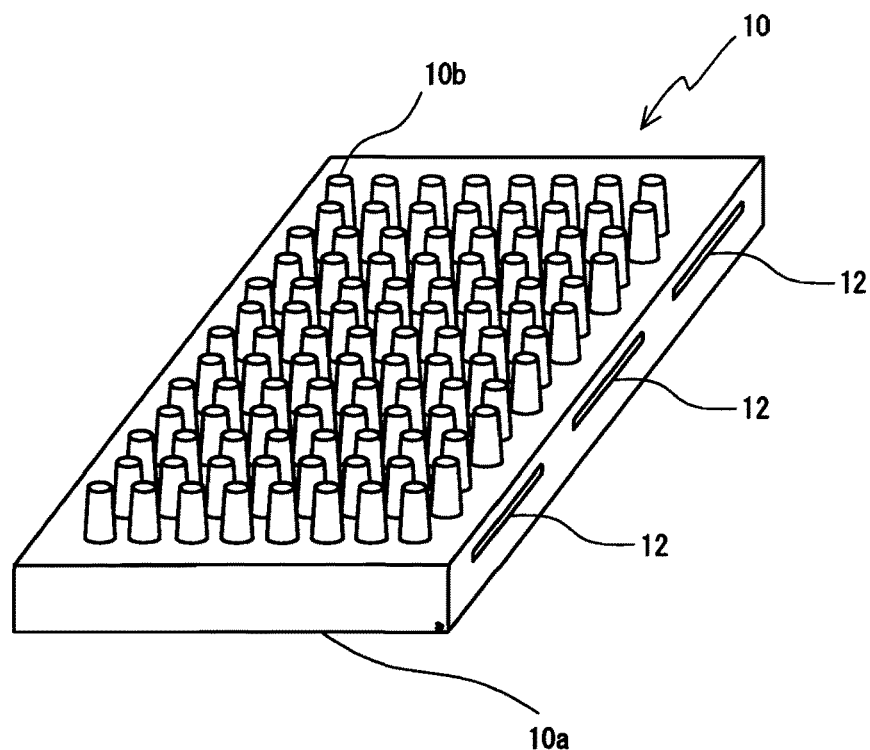
FIG. 1A is a perspective view of the first preferred embodiment of a heat radiating plate according to the present invention.
Figure 1B:
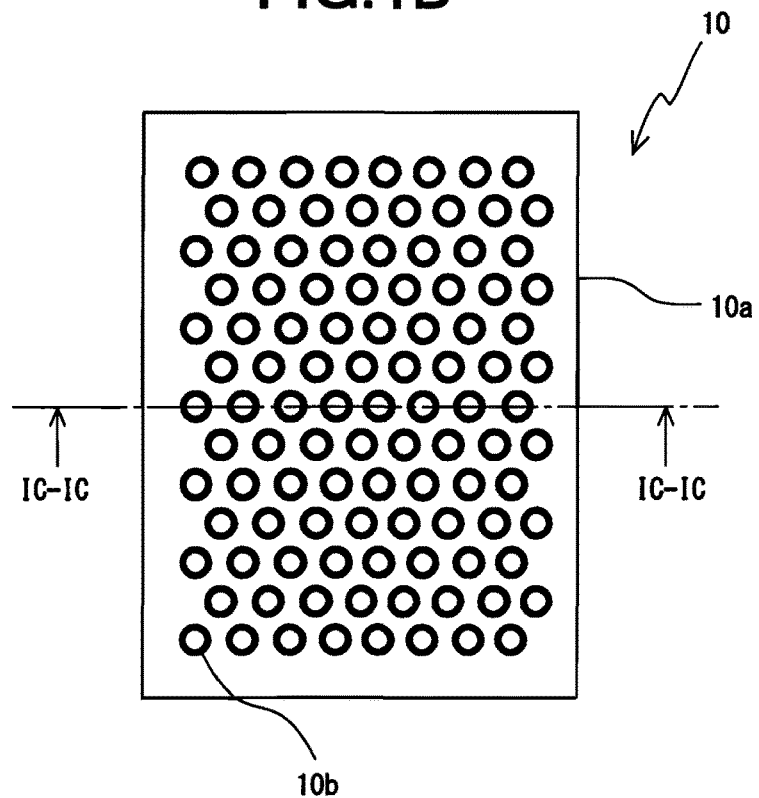
FIG. 1B is a plan view of the heat radiating plate of FIG. 1A.
Figure 1C:
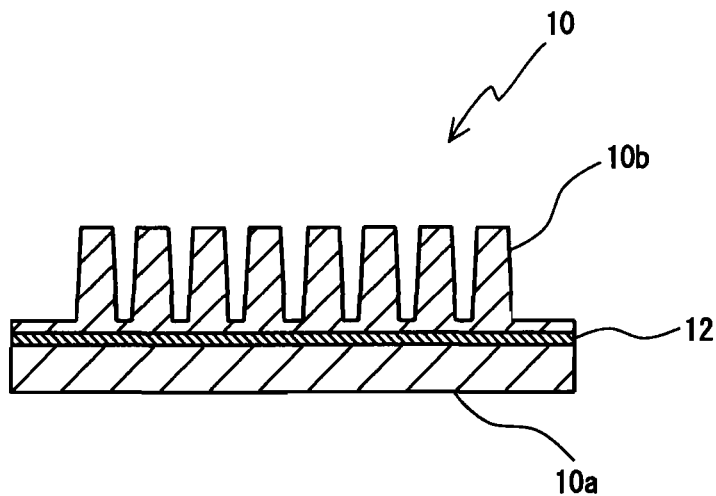
FIG. 1C is a sectional view taken along line IC-IC of FIG. 1B.

FIGS. 1A through 1C show the first preferred embodiment of a heat radiating plate according to the present invention. FIG. 1A is a perspective view of a heat radiating plate in this preferred embodiment, FIG. 1B is a plan view of the heat radiating plate of FIG. 1A, and FIG. 1C is a sectional view taken along line IC-IC of FIG. 1B.

In this preferred embodiment, a heat radiating plate 10 is made of a metal material, such as aluminum or an aluminum alloy. As shown in FIGS. 1A through 1C, the heat radiating plate 10 comprises: a flat plate portion 10a having a substantially rectangular planar shape; a large number of columnar (or pillar) protruding portions 10b (serving as radiating fins) integrated with the flat plate portion 10a so as to protrude from one major surface of the flat plate portion 10a; and one or a plurality of reinforcing plate members (three elongated reinforcing plate members having rectangular planar and sectional shapes in this preferred embodiment) 12 of a metal or ceramic, which are arranged in the flat plate portion 10a.

Each of the columnar protruding portions 10b has a shape of substantially cylindrical or circular truncated cone (a shape obtained by cutting the upper end portion of a substantially circular cone in directions substantially parallel to the bottom face thereof). The protruding portions 10b extend in directions substantially perpendicular to the major surface of the flat plate portion 10a. The columnar protruding portions 10b are arranged as a plurality of rows of columnar protruding portions 10b. In each row, the columnar protruding portions 10b are arranged at regular intervals. Each row of the columnar protruding portions 10b linearly extends, and the rows of the columnar protruding portions 10b are arranged in parallel to each other. Adjacent two rows of the columnar protruding portions 10b are arranged so as to be shifted from each other by a half pitch (by half of a distance between the central lines (axes Of the columnar protruding portions 10b) of adjacent two rows of the columnar protruding portions 10b). Thus, the larger number of columnar protruding portions 10b are arranged so that the distance between the adjacent two of the columnar protruding portions 10b is ensured. If the larger number of columnar protruding portions 10b can be arranged so that the distance between the adjacent two of the columnar protruding portions 10b is ensured, other arrangement may be adapted. In this preferred embodiment, the flat plate portion 10a has a thickness of about 3 to 10 mm. Each of the columnar protruding portions 10b has, e.g., a root diameter (a diameter of the bottom face thereof) of 1 to 10 mm, preferably 1.5 to 8 mm, and a height of about 2 to 50 mm, preferably about 5 to 15 mm. The columnar protruding portions 10b are arranged at intervals (or pitches) of about 2 to 10 mm, preferably about 3 to 7 mm (so as to be apart from each other by a distance about 2 to 10 mm, preferably about 3 to 7 mm, between the central lines of adjacent columnar protruding portions 10b). Each of the columnar protruding portions 10b has a tapered angle (an angle between the central line of each of the columnar protruding portions 10b and the side face thereof) of 0.5 to 5°, preferably 1 to 3°. The number of the columnar protruding portions 19b is, e.g., preferably about 20 to 1000, more preferably 50 to 1000.

The reinforcing members 12 pass through the interior of the flat plate portion 10a from one of both end faces in width directions (lateral directions perpendicular to longitudinal directions and thickness directions) thereof to the other end face to extend in the width directions. The reinforcing members 12 are arranged in a region (a region close to a highest stress region between the heat radiating plate 10 and a mold 20 shown in FIGS. 2A through 2D), which is close to one major surface (a major surface on the side of the columnar protruding portions 10b) of the flat plate portion 10b of the heat radiating plate 10, so that the (apparent) thermal expansion coefficient of the one major surface (the major surface on the side of the columnar protruding portions 10b) of the flat plate portion 10a of the heat radiating plate 10 approaches that of the mold 20. The reinforcing members 12 are preferably arranged in a region which is apart from the one major surface (the major surface on the side of the columnar protruding portions 10b) of the flat plate portion 10a by 20% or less of the thickness of the flat plate portion 10a. In this preferred embodiment, the reinforcing members 12 are arranged in a region which is apart from the one major surface of the flat plate portion 10b by a distance of preferably 0.1 to 1.0 mm, more preferably 0.15 to 0.8 mm, and most preferably 0.2 to 0.7 mm (since the distance is preferably 0.2 mm or more in order to allow the molten metal to be easily injected into the mold).

The both end faces of the reinforcing members 12 in longitudinal directions thereof (in width directions of the flat plate portion 10a) are exposed to the outside. The whole surface of each of the reinforcing members 12 except for the both end faces thereof (the whole surface of a portion of each of the reinforcing members 12 passing through the flat plate portion 10a to extend therein) is bonded directly to the flat plate portion 10a. Thus, the reinforcing members 12 passing through the flat plate portion 10a from one of both end faces in width directions thereof to the other end face to extend in the width directions are provided in the region close to the one major surface (the major surface on the side of the columnar protruding portions 10b) of the flat plate portion 10a, so that it is possible to easily release the heat radiating plate 10 from the mold 20 after the heat radiating plate 10 is produced by the mold 20.

Furthermore, the flat plate portion 10a and the columnar protruding portions 10b integrated therewith are preferably made of aluminum or an aluminum alloy from the standpoints of electric conductivity, thermal conductivity and reliability of bonding to a ceramic substrate (when the ceramic substrate is bonded to the other major surface of the flat plate portion 10a of the heat radiating plate 10). The reinforcing members 12 are preferably made of a material which has a higher melting point than that of the flat plate portion 10a and columnar protruding portions 10b. If the reinforcing members 12 are made of a metal material, they are preferably made of a steel or iron containing metal, which is inexpensive and which has a high strength. The iron containing metal is preferably a metal which contains iron and at least one selected from the group consisting of nickel, cobalt, copper and manganese. If the reinforcing members 12 are made of a ceramic material, they are preferably made of at least one selected from the group consisting of alumina, aluminum nitride, silicon nitride and silicon carbide, and more preferably aluminum nitride in view of the heat radiating performance thereof.

The heat radiating plate 10 in the preferred embodiment shown in FIGS. 1A through 1C can be produced by a method comprising the steps of: allowing both end portions of each of the reinforcing members 12 in longitudinal directions thereof to be supported on the mold 20 so as to arrange the reinforcing members 12 in the mold 20 shown in FIGS. 2A through 2D; injecting a molten metal into the mold 20 so that the molten metal contacts the whole surface of each of the reinforcing members 12 except for both end portions in longitudinal directions thereof; and then, cooling the mold 20.

Figure 2A:
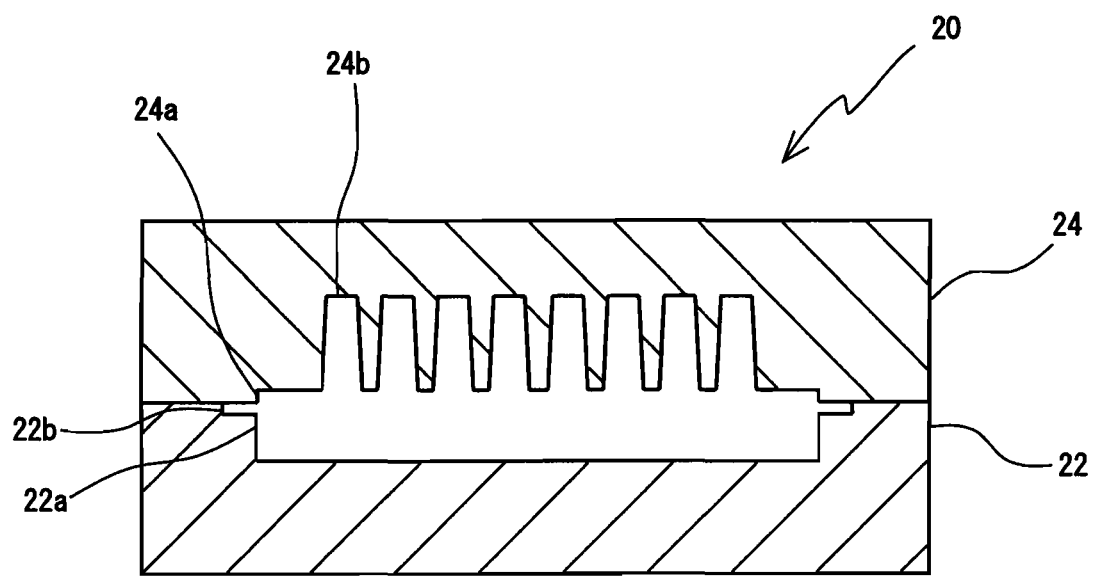
FIG. 2A is a sectional view of a mold used for producing the heat radiating plate shown in FIGS. 1A through 1C.

As shown in FIG. 2A, the mold 20 of carbon or the like comprises a lower mold member 22 and an upper mold member 24, each of which has a substantially rectangular planar shape.

Figure 2B:
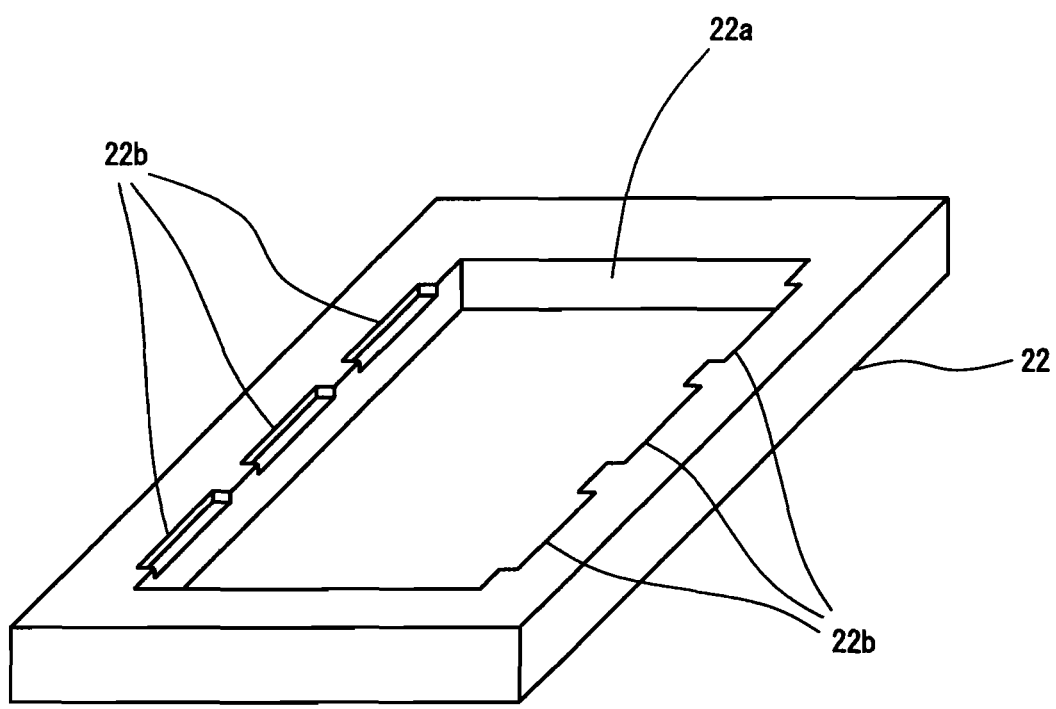
FIG. 2B is a perspective view of a lower mold member of the mold of FIG. 2A.
Figure 2C:
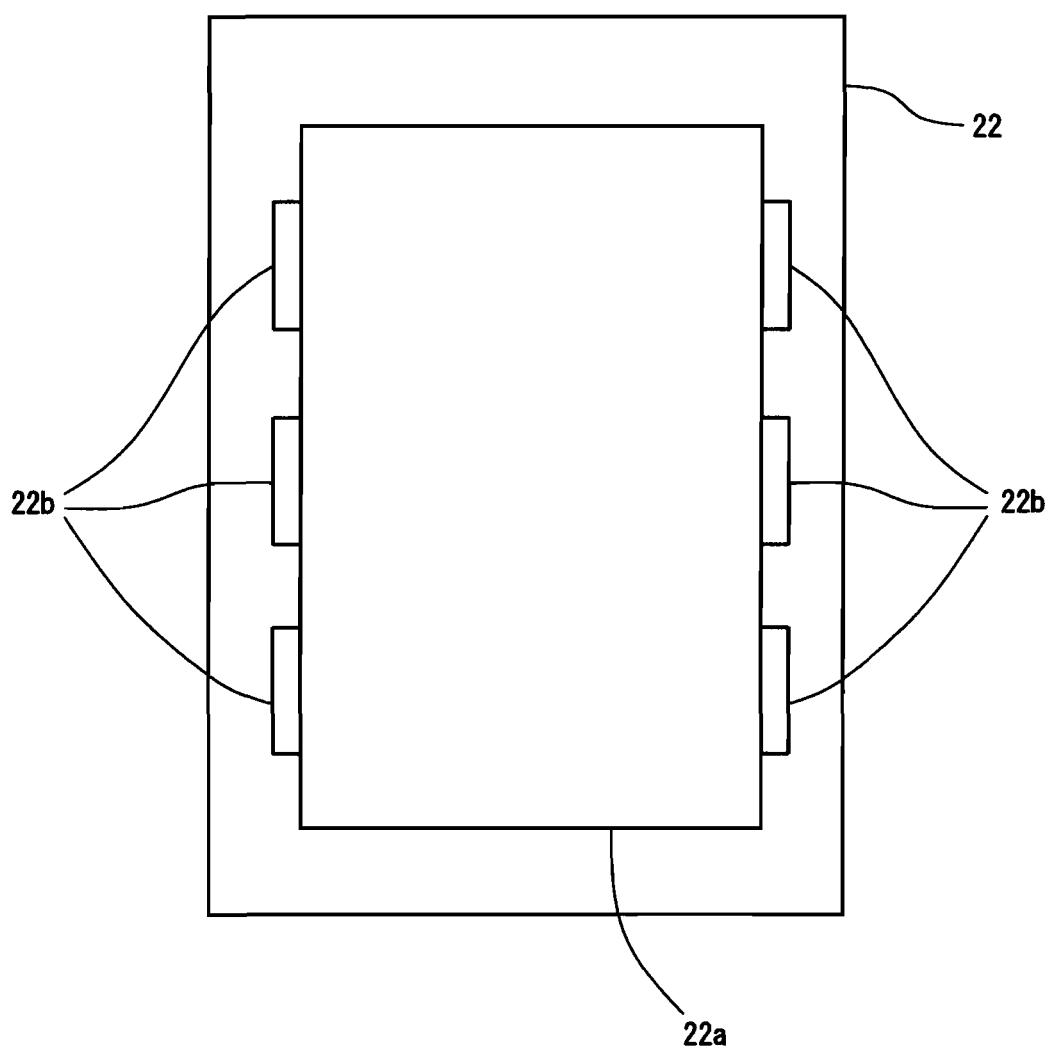
FIG. 2C is a plan view of the lower mold member of the mold of FIG. 2A.

As shown in FIGS. 2A through 2C, the top face of the lower mold member 22 has a recessed portion (a flat plate forming portion) 22a for forming a portion of the flat plate portion 10a on the side of the other major surface (the major surface on the opposite side to the columnar protruding portions 10b) thereof. The upper portion of each of both side faces of the flat plate forming portion 22a in width directions thereof has recessed portions (reinforcing member supporting portions) 22b, each of which substantially has the same shape and size as those of a corresponding one of both end portions of a corresponding one of the reinforcing members 12 in longitudinal directions thereof and which are spaced from each other, for housing therein the both end portions thereof.

Figure 2D:
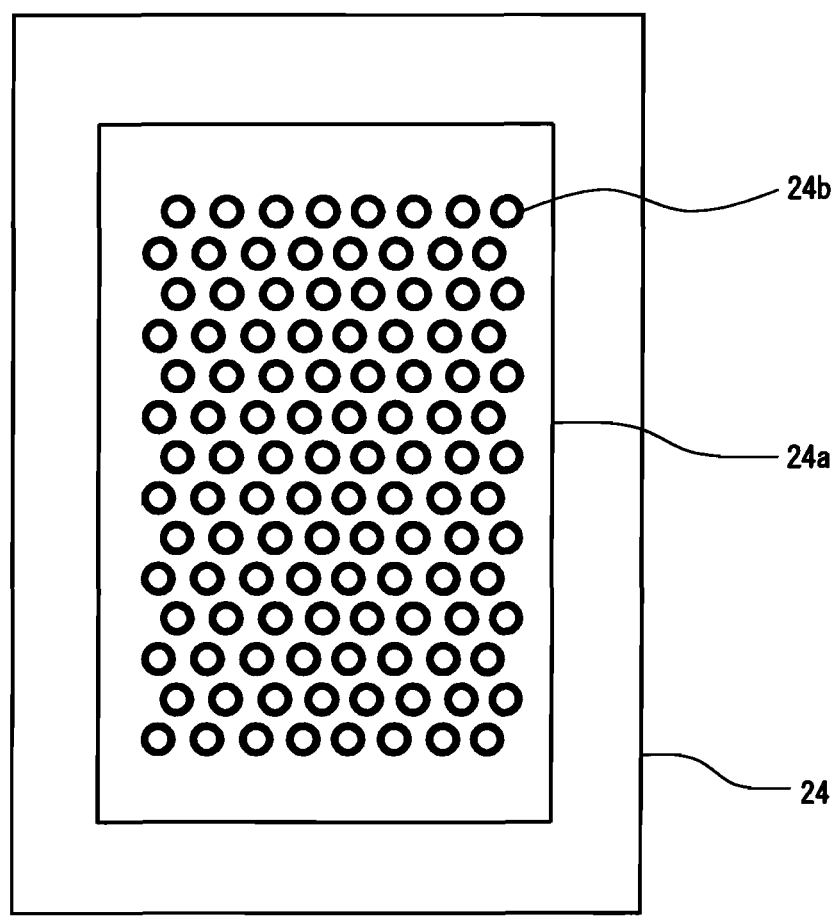
FIG. 2D is a bottom view of an upper mold member of the mold of FIG. 2A.

As shown in FIGS. 2A and 2D, the under surface (reverse face) of the upper mold member 24 has a recessed portion (a flat plate forming portion) 24a for forming a portion of the flat plate portion 10a on the side of the one major surface (the major surface on the side of the columnar protruding portions 10b) thereof (a portion of the flat plate portion 10a nearer to the columnar protruding portions 10b than the reinforcing members 12). The bottom face of the recessed portion 24a has a large number of recessed portions (columnar protrusion forming portions) 24b for forming a large number of columnar protruding portions 10b. The flat plate portion 10a is designed to be formed in a space defined by the flat plate forming portion 24a of the upper mold member 24 and the flat plate forming portion 22a of the lower mold member 22. The reinforcing members 12 are designed to be clamped between the upper mold member 24 and the reinforcing member supporting portions 22b of the lower mold member 22 when the lower mold member 22 is covered with the upper mold member 24 after the reinforcing members 12 are housed in the reinforcing member supporting portions 22b of the lower mold member 22. When the reinforcing members 12 are thus clamped, it is possible to precisely fix the reinforcing members 12 at predetermined positions (at predetermined positions in directions along the major surface of the flat plate portion 10a and in thickness directions thereof). The distance (the width of the flat plate portion 22a) between the reinforcing member supporting portions 22b for supporting both end portions of each of the reinforcing members 12 is preferably such a length that a corresponding one of the reinforcing members 12 is not deflected by the molten metal in the mold 20. For example, the distance is preferably 75 mm or less when the thickness of each of the reinforcing members 12 is 0.6 mm, and it may be longer when each of the reinforcing members 12 is thicker. Furthermore, the lower mold member 22 or the upper mold member 24 has an inlet (not shown) for injecting a molten metal into the flat plate forming portion 24a from an injecting nozzle (not shown).

In order to use such a mold 20 for producing the preferred embodiment of a heat radiating plate shown in FIG. 1A through 1C, the reinforcing members 12 are put on the reinforcing member supporting portions 22b of the lower mold member 22, and then, the lower mold member 22 is covered with the upper mold member 24. In this state, if a molten metal of aluminum, an aluminum alloy or the like is injected into the mold 20 and cooled, it is possible to produce the heat radiating plate 10 wherein the reinforcing members 12 are arranged in the flat plate portion 10a, wherein both end portions of the reinforcing members 12 in longitudinal directions thereof protrude from the side faces of the flat plate portion 10a, and wherein the columnar protruding portions 10b are integrated with one major surface of the flat plate portion 10a. Thereafter, the both end portions of each of the reinforcing members 12 in the longitudinal directions thereof, the both end portions protruding from the flat plate portion 10a, are cut by a well-known cutting method, so that it is possible to produce the heat radiating plate 10 in the preferred embodiment shown in FIGS. 1A through 1C. Furthermore, if dividing grooves (break lines) are previously and precisely formed at the cutting portions of the reinforcing members 12 by means of a laser, a scriber or the like, it is possible to easily divide and remove the both end portions of the reinforcing members 12 (by hand).

The molten metal is preferably injected into the mold 20 as follows. First, the mold 20 is moved into a furnace (not shown), and the interior of the furnace is caused to be in an atmosphere of nitrogen to decrease the oxygen concentration therein to 100 ppm or less, preferably 10 ppm or less. Then, the mold 20 is heated to a molten metal injecting temperature (e.g., 600 to 800° C. when a molten metal of aluminum or an aluminum alloy is injected) by the temperature control of a heater. Thereafter, while oxide films on the surface of a molten metal are removed, the molten metal, which is heated to the molten metal injecting temperature and which is previously measured, is pressurized at a predetermined pressure by nitrogen gas to be injected into the mold 20 from the inlet. After the molten metal is injected into the mold 20, nitrogen gas is preferably blown into the inlet from a nozzle (not shown) to cool and solidify the molten metal in the mold 20 while pressurizing the molten metal therein at a predetermined pressure. The predetermined pressure applied by nitrogen gas during the injection and cooling of the molten metal is preferably in the range of from 1 kPa to 100 kPa, more preferably in the range of from 3 kPa to 80 kPa, and most preferably in the range of from 5 kPa to 15 kPa. If the pressure is too low, it is difficult to allow the molten metal to be injected into the mold 20 (particularly into the columnar protrusion forming portions 24b of the mold 20). If the pressure is too high, there is some possibility that the positions of the reinforcing members 12 may be shifted and/or the mold 20 may be broken. In particular, when a high pressure of not less than 1 MPa is applied if the mold 20 of carbon is used, there is some possibility that the mold 20 may be broken and/or the molten metal may leak from the mold 20 and/or the positions of the reinforcing members 12 may be shifted.

In this preferred embodiment, it is possible to radiate heat from heating elements if parts required to radiate heat from the heating elements, such as a metal/ceramic bonding substrate mounting thereon semiconductor chips and so forth, are mounted on the other major surface (the major surface on the opposite side to the columnar protruding portions 10b) of the flat plate portion 10a of the heat radiating plate 10.

[Second Preferred Embodiment]

Figure 3A:
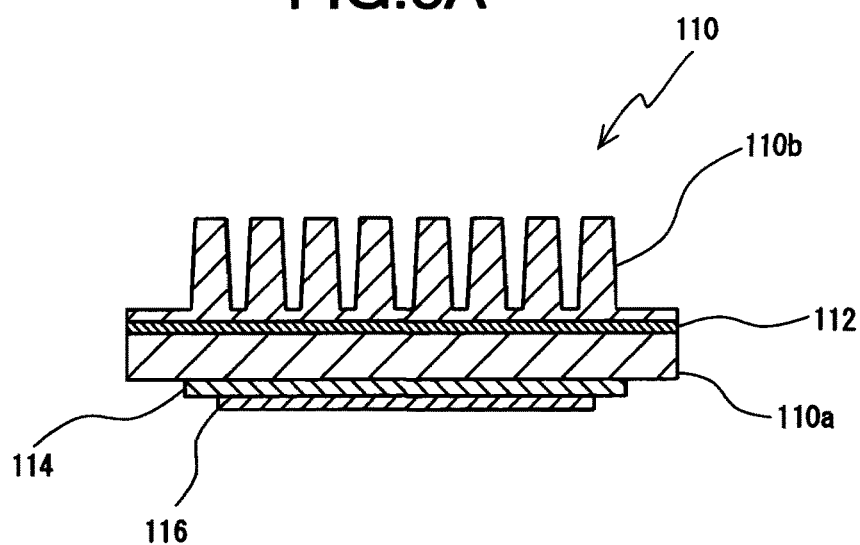
FIG. 3A is a sectional view of the second preferred embodiment of a heat radiating plate according to the present invention.
Figure 3B:
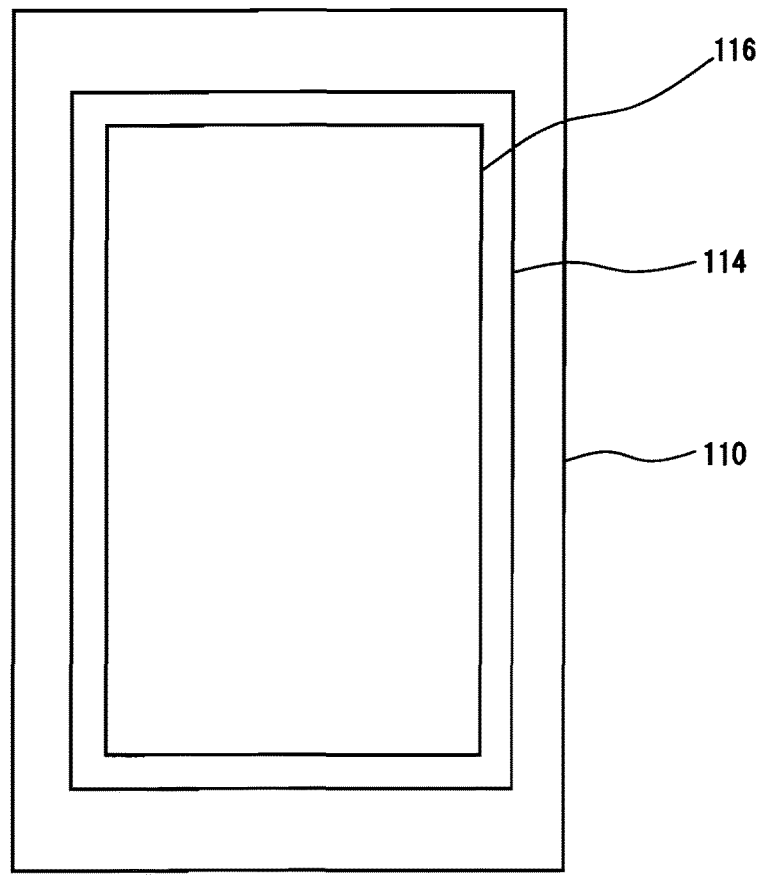
FIG. 3B is a plan view of the heat radiating plate of FIG. 3A (on the side of a metal/ceramic bonding substrate)

FIGS. 3A and 3B show the second preferred embodiment of a heat radiating plate according to the present invention. FIG. 3A is a sectional view of the heat radiating plate in this preferred embodiment, and FIG. 3B is a plan view of the heat radiating plate of FIG. 3A (on the side of a metal/ceramic bonding substrate).

In this preferred embodiment, the same heat radiating plate as that in the first preferred embodiment is bonded to and integrated with parts required to radiate heat from the heating elements, such as a metal/ceramic bonding substrate mounting thereon semiconductor chips and so forth.

In this preferred embodiment, as shown in FIGS. 3A and 3B, a large number of columnar protruding portions 110b are formed on one major surface of a flat plate portion 110a of a heat radiating plate 110, and reinforcing members 112 are arranged in the flat plate portion 110a thereof. One major surface of at least one (one in this preferred embodiment) ceramic substrate 114 is bonded to the other major surface (the major surface on the opposite side to the columnar protruding portions 110b) of the flat plate portion 110a of the heat radiating plate 110. The other major surface of the ceramic substrate 114 is bonded to a metal plate 116. Thus, the heat radiating plate 110 is integrated with and bonded to the metal/ceramic bonding substrate wherein the metal plate 116 is bonded to the ceramic substrate 114. When the metal/ceramic bonding substrate is integrated with and bonded to the heat radiating plate 110 as this preferred embodiment, the reinforcing members 112 are preferably arranged in a region which is apart from the one major surface (the major surface on the side of the columnar protruding portions 110b) by a distance of 0.5 to 2.5 times as long as the thickness of the metal plate 116, and more preferably arranged in a region which is apart from the one major surface by a distance of 0.7 to 2 times as long as the thickness of the metal plate 116. Furthermore, in FIGS. 3A and 3B and in FIGS. 4A through 4D which will be described later, 100 is added to each of the reference numbers of portions having the same constructions as those of the heat radiating plate 10 in the above-described preferred embodiment.

The heat radiating plate 110 thus integrated with and bonded to the metal/ceramic bonding substrate can be produced by a method comprising the steps of: allowing the peripheral portion of the ceramic substrate 114 and both end portions of each of the reinforcing members 112 in longitudinal directions thereof to be supported on a mold 120 so as to arrange the ceramic substrate 114 and the reinforcing members 112 at a predetermined interval in the mold 120 shown in FIGS. 4A through 4D; injecting a molten metal into the mold 120 so that the molten metal contacts both sides of the ceramic substrate 114 and the whole surface of each of the reinforcing members 112 except for both end portions in longitudinal directions thereof; and then, cooling the mold 120.

Figure 4A:
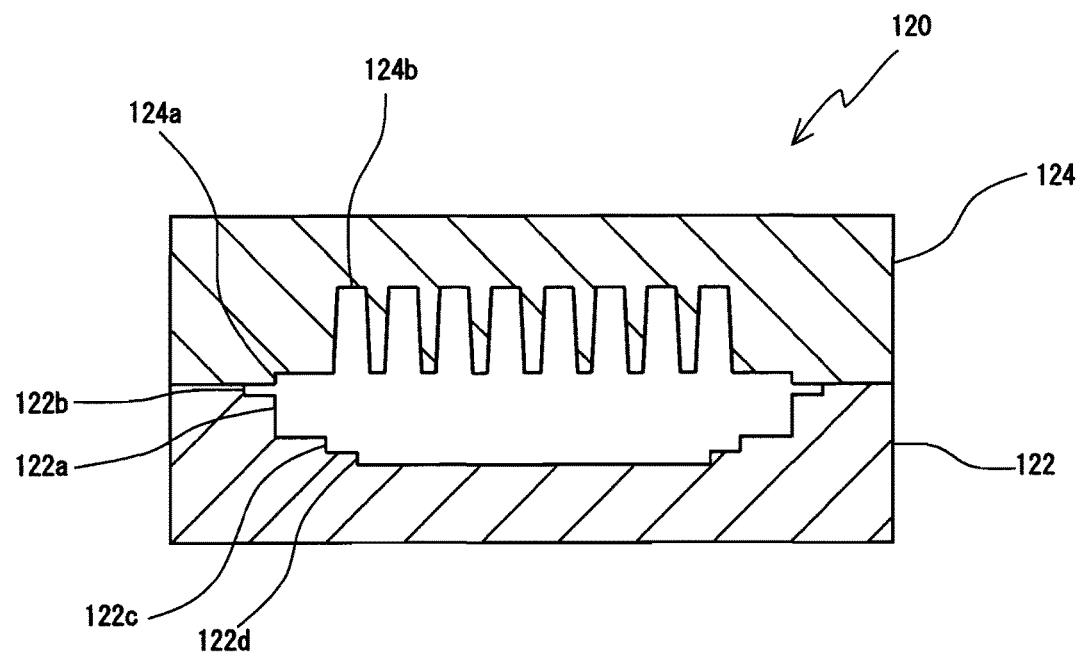
FIG. 4A is a sectional view of a mold used for producing the heat radiating plate shown in FIGS. 3A and 3B.

As shown in FIG. 4A, the mold 120 of carbon or the like comprises a lower mold member 122 and an upper mold member 124, each of which has a substantially rectangular planar shape.

Figure 4B:
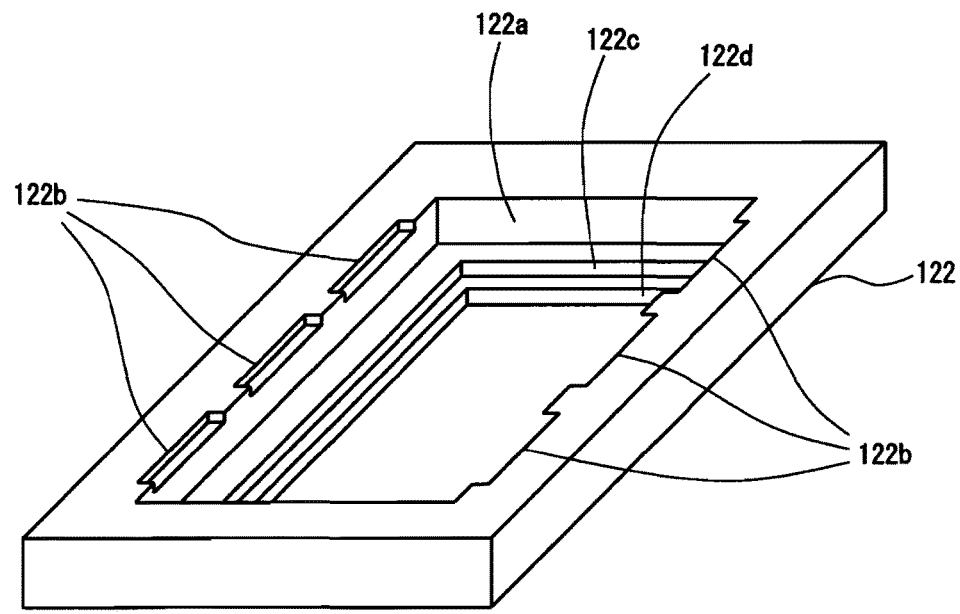
FIG. 4B is a perspective view of a lower mold member of the mold of FIG. 4A.
Figure 4C:
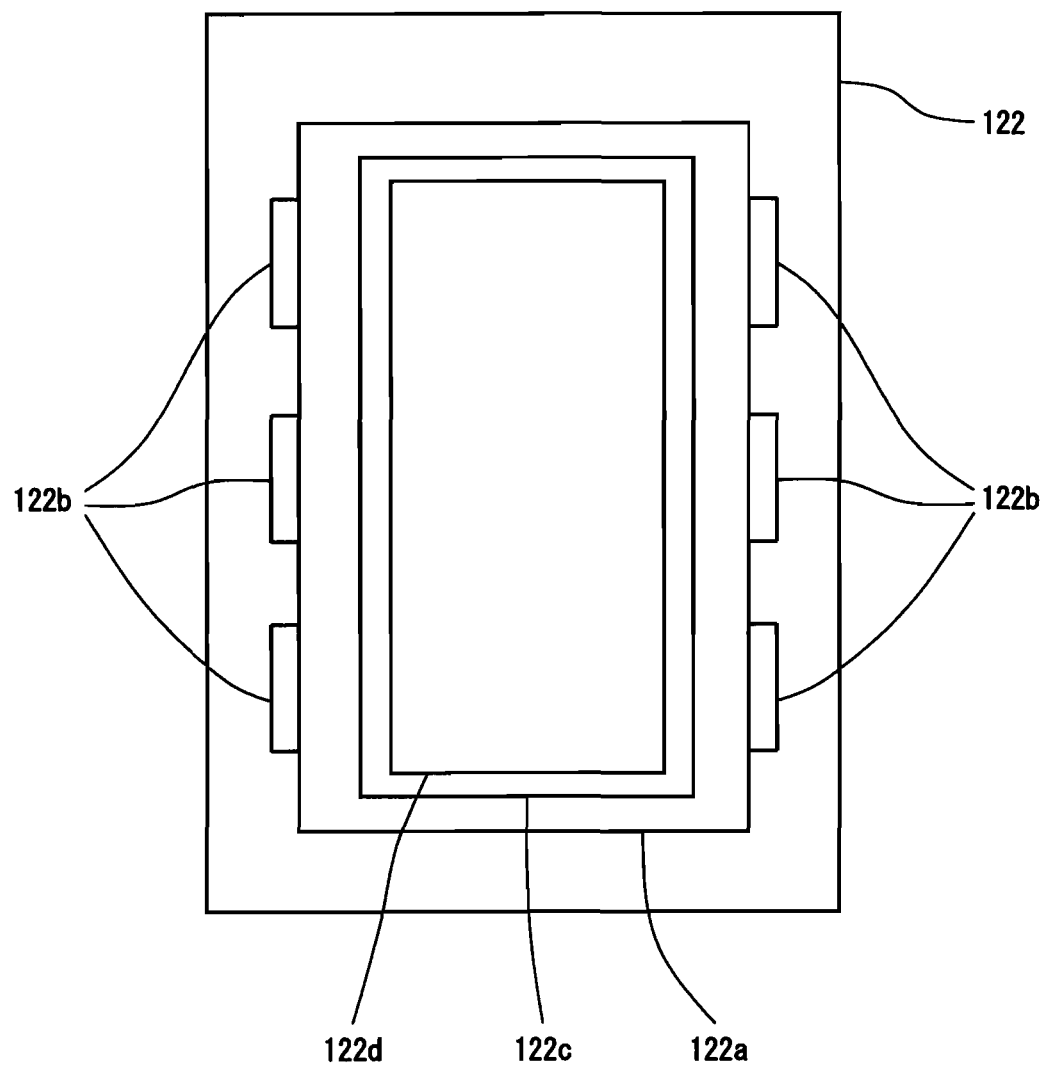
FIG. 4C is a plan view of the lower mold member of the mold of FIG. 4A.

As shown in FIGS. 4A through 4C, the top face of the lower mold member 122 has a recessed portion (a flat plate forming portion) 122a for forming a portion of the flat plate portion 110a on the side of the other major surface (the major surface on the opposite side to the columnar protruding portions 110b) thereof. The bottom face of the recessed portion 122a has a recessed portion (a ceramic substrate housing portion) 122c, which substantially has the same shape and size as those of the ceramic substrate 114, for housing therein the ceramic substrate 114. The bottom face of the recessed portion 122c has a recessed portion (a metal plate forming portion) 122d for forming a metal plate 116 for a circuit pattern. The upper portion of each of both side faces of the flat plate forming portion 122a in width directions thereof has recessed portions (reinforcing member supporting portions) 122b, each of which substantially has the same shape and size as those of a corresponding one of both end portions of a corresponding one of the reinforcing members 112 in longitudinal directions thereof and which are spaced from each other, for housing therein the both end portions thereof.

Figure 4D:
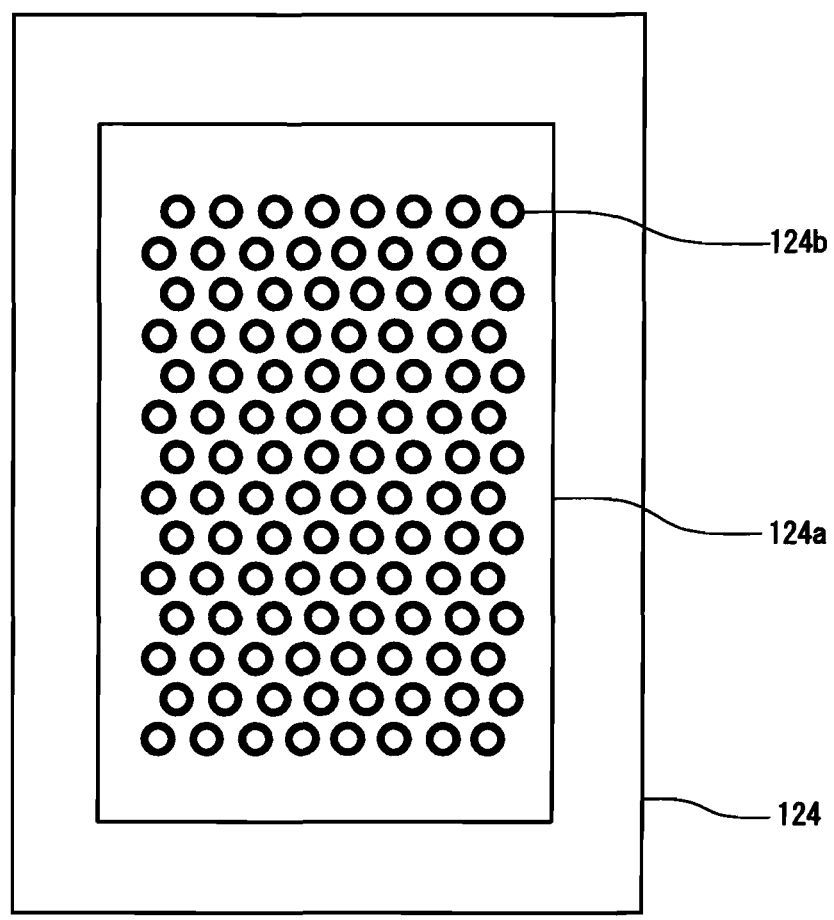
FIG. 4D is a bottom view of an upper mold member of the mold of FIG. 4A.

As shown in FIGS. 4A and 4D, the under surface (reverse face) of the upper mold member 124 has a recessed portion (a flat plate forming portion) 124a for forming a portion of the flat plate portion 110a on the side of the one major surface (the major surface on the side of the columnar protruding portions 110b) thereof (a portion of the flat plate portion 110a nearer to the columnar protruding portions 110b than the reinforcing members 112). The bottom face of the recessed portion 124a has a large number of recessed portions (columnar protrusion forming portions) 124b for forming a large number of columnar protruding portions 110b. The flat plate portion 110a is designed to be formed in a space defined by the flat plate forming portion 124a of the upper mold member 124 and the flat plate forming portion 122a of the lower mold member 122. The reinforcing members 112 are designed to be clamped between the upper mold member 124 and the reinforcing member supporting portions 122b of the lower mold member 122 when the lower mold member 122 is covered with the upper mold member 124 after the reinforcing members 112 are housed in the reinforcing member supporting portions 122b of the lower mold member 122. When the reinforcing members 112 are thus clamped, it is possible to precisely fix the reinforcing members 112 at predetermined positions (at predetermined positions in directions along the major surface of the flat plate portion 110a and in thickness directions thereof). The distance (the width of the flat plate portion 122a) between the reinforcing member supporting portions 122b for supporting both end portions of each of the reinforcing members 112 is preferably such a length that a corresponding one of the reinforcing members 112 is not deflected by the molten metal in the mold 120. For example, the distance is preferably 75 mm or less when the thickness of each of the reinforcing members 112 is 0.6 mm, and it may be longer when each of the reinforcing members 112 is thicker.

The upper mold member 124 has an inlet (not shown) for injecting a molten metal into the flat plate forming portion 129a from an injecting nozzle (not shown). The lower mold member 122 has a molten metal passage (not shown) which extends between the flat plate forming portion 122a and the metal plate forming portion 122d for establishing a communication between the flat plate forming portion 122a and the metal plate forming portion 122d even if the ceramic substrate 114 is housed in the ceramic substrate housing portion 122c.

In order to use such a mold 120 for producing a heat radiating plate 110, which is integrated with and bonded to a metal/ceramic bonding substrate, as shown in FIGS. 3A and 3B, after the ceramic substrate 114 is arranged in the ceramic substrate housing portion 122c of the lower mold member 122, the reinforcing members 112 are put on the reinforcing member supporting portions 122b of the lower mold member 122, and then, the lower mold member 122 is covered with the upper mold member 124. In this state, if a molten metal of aluminum, an aluminum alloy or the like is injected into the mold 120 and cooled, it is possible to produce the heat radiating plate 110 which is integrated with and bonded to the metal/ceramic bonding substrate, wherein both end portions of each of the reinforcing members 112 in longitudinal directions thereof, the reinforcing members 112 being arranged in the flat plate portion 110a, protrude from the side faces of the flat plate portion 110a and wherein the columnar protruding portions 110b are integrated with one major surface of the flat plate portion 110a, the other major surface thereof being bonded directly to one side of the ceramic substrate 114, the other side thereof being bonded directly to the metal plate 116 for a circuit pattern. Thereafter, the both end portions of each of the reinforcing members 112 in the longitudinal directions thereof, the both end portions protruding from the flat plate portion 110a, are cut by a well-known cutting method, so that it is possible to produce the heat radiating plate 110 in the preferred embodiment shown in FIGS. 3A through 3C.

The molten metal is preferably injected into the mold 120 as follows. First, the mold 120 is moved into a furnace (not shown), and the interior of the furnace is caused to be in an atmosphere of nitrogen to decrease the oxygen concentration therein to 100 ppm or less, preferably 10 ppm or less. Then, the mold 120 is heated to a molten metal injecting temperature (e.g., 600 to 800° C. when a molten metal of aluminum or an aluminum alloy is injected) by the temperature control of a heater. Thereafter, the molten metal, which is heated to the molten metal injecting temperature and which is previously measured, is pressurized at a predetermined pressure by nitrogen gas to be injected into the mold 120 from the inlet. If the molten metal is thus injected, it is possible to prevent large bonding defects from being produced between the metal and the ceramic. After the molten metal is injected into the mold 120, nitrogen gas is preferably blown into the inlet from a nozzle (not shown) to cool and solidify the molten metal in the mold 120 while pressurizing the molten metal therein at a predetermined pressure. The predetermined pressure applied by nitrogen gas during the injection and cooling of the molten metal is preferably in the range of from 1 kPa to 100 kPa, more preferably in the range of from 3 kPa to 80 kPa, and most preferably in the range of from 5 kPa to 15 kPa. If the pressure is too low, it is difficult to allow the molten metal to be injected into the mold 120. If the pressure is too high, there is some possibility that the positions of the reinforcing members 12 may be shifted and/or the mold 120 may be broken. In particular, when a high pressure of not less than 1 MPa is applied if the mold 120 of carbon is used, there is some possibility that the mold 120 may be broken and/or the molten metal may leak from the mold 120 and/or the positions of the reinforcing members 112 and ceramic substrate 114 may be shifted.

In order to form a metal circuit plate from the metal plate 116 of the metal/ceramic bonding substrate thus integrated with and bonded to the heat radiating plate 110, the metal plate 116 may be etched to form a circuit pattern. In order to enable the circuit pattern to be soldered, the circuit pattern may be coated with Ni plating or Ni alloy plating.

[Third Preferred Embodiment]

Figure 5A:
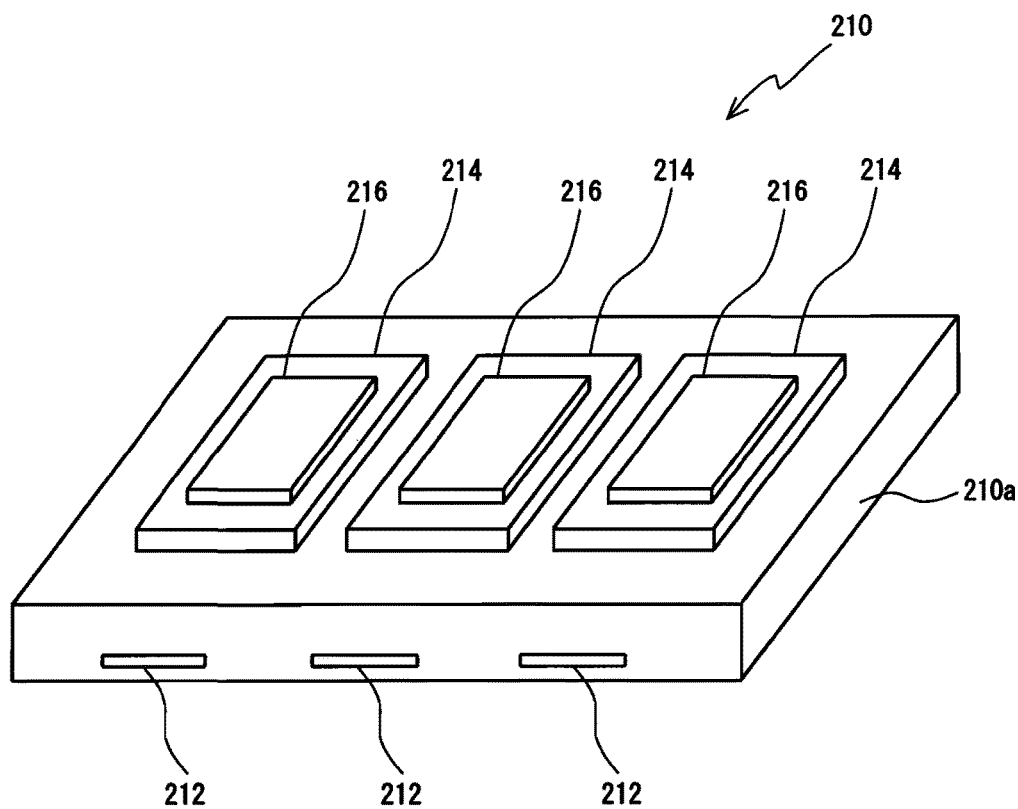
FIG. 5A is a perspective view of the third preferred embodiment of a heat radiating plate according to the present invention.
Figure 5B:
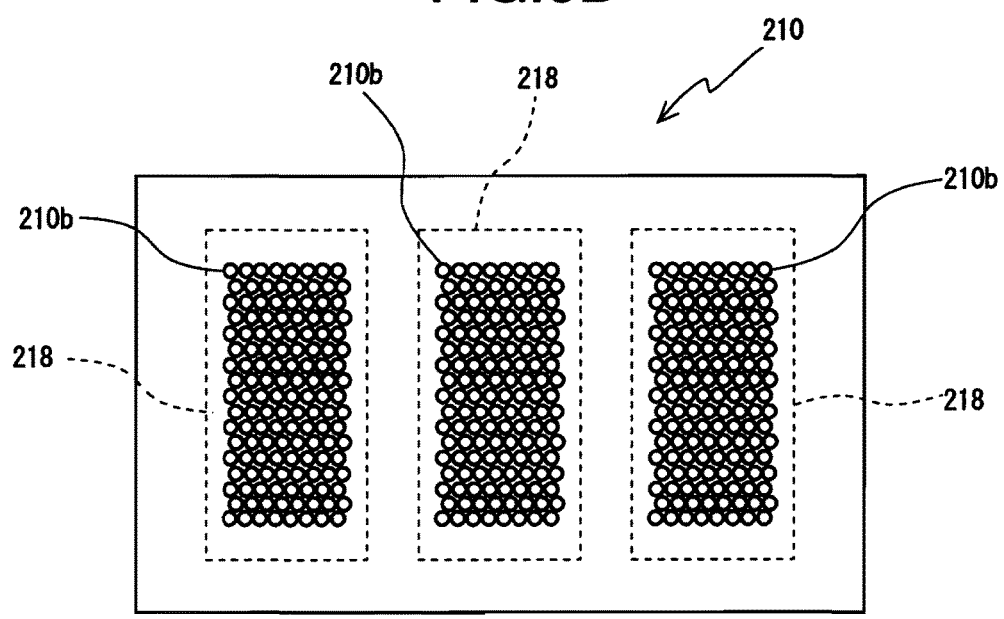
FIG. 5B is a plan view of the heat radiating plate of FIG. 5A (on the side of columnar protruding portions)

FIGS. 5A and 5B show the third preferred embodiment of a heat radiating plate according to the present invention. FIG. 5A is a perspective view of the heat radiating plate in this preferred embodiment, and FIG. 5B is a plan view of the heat radiating plate of FIG. 5A (on the side of columnar protruding portions).

In this preferred embodiment, as shown in FIGS. 5A and 5B, columnar protruding portions 210b may be formed on one major surface of a flat plate portion 210a of a heat radiating plate 210 so as to correspond to regions (heating element mounting regions) 218 (on the other major surface of the flat plate portion 210a) on which parts required to radiate heat from heating elements, such as a metal/ceramic bonding substrate mounting thereon semiconductor chips and so forth, are arranged. Furthermore, in FIGS. 5A and 5B, 200 is added to each of the reference numbers of portions having the same constructions as those of the heat radiating plate 10 in the above-described preferred embodiment.

Figure 6:
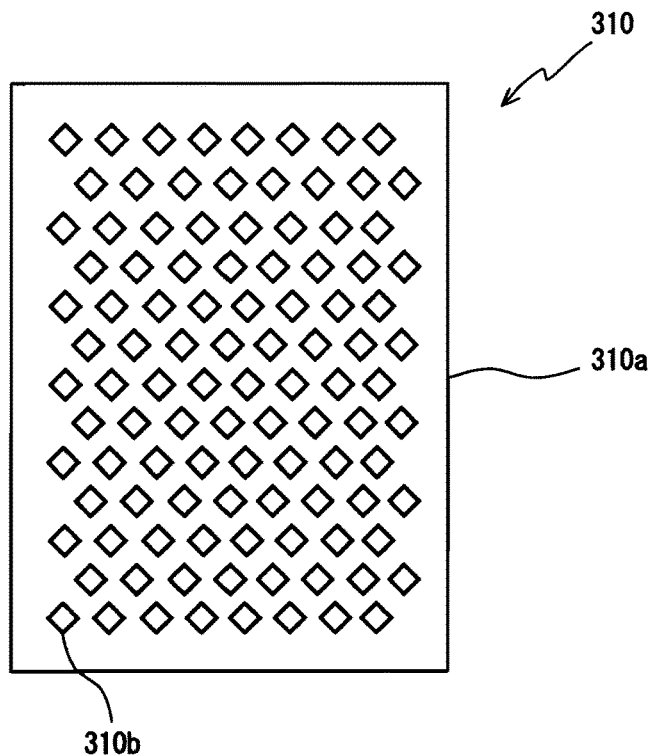
FIG. 6 is a plan view of a first modified example of columnar protruding portions of a heat radiating plate in the first through third preferred embodiments.
Figure 7:
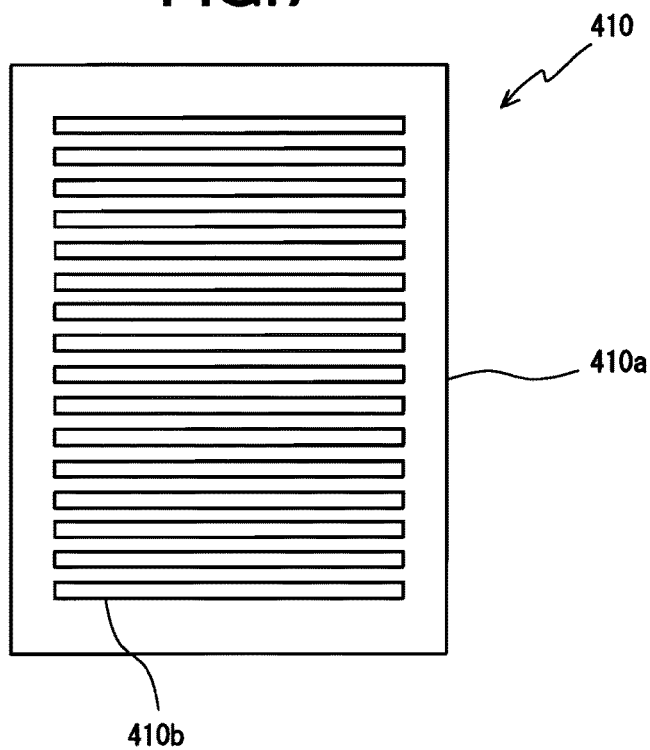
FIG. 7 is a plan view of a second modified example of columnar protruding portions of a heat radiating plate in the first through third preferred embodiments.

While each of the columnar protruding portions 10b, 110b and 210b has a shape of substantially cylindrical or circular truncated cone in the above-described first through third preferred embodiments, it may have a shape of substantially rectangular column as shown in FIG. 6, or it may have a shape of substantially flat plate as shown in FIG. 7. Furthermore, in FIGS. 6 and 7, 300 and 400 are added to each of the reference numbers of portions having the same constructions as those in the above-described preferred embodiment, respectively.

While each of the heat radiating plates uses an air-cooled radiating fins (columnar protruding portions 10b, 110b, 210b) in the above-described first through third preferred embodiments, each of the columnar protruding portions 10b, 110b and 210b may be covered with a casing (not shown) to form a water-cooled heat radiator, in which a cooling fluid flows, in order to enhance the cooling power thereof.

Examples of a heat radiating plate and a method for producing the same according to the present invention will be described below in detail.

EXAMPLE 1

First, there was prepared a mold of carbon having a similar shape to that of the mold 120 shown in FIGS. 4A through 4D, except that the number of reinforcing member supporting portions 122b was changed from three pairs to one pair. There were also prepared a ceramic substrate 114 of aluminum nitride having a size of 90 mm×40 mm×0.6 mm, and a reinforcing member 112 of aluminum nitride having a size of 90 mm×56 mm×0.6 mm. Then, the ceramic substrate 114 was arranged in the ceramic substrate housing portion 122c of the lower mold member 122 of the mold 120, and both end portions (having a length of 3 mm) of the reinforcing member 112 were arranged in the reinforcing member supporting portions 122b of the lower mold member 122, respectively. Thereafter, the lower mold member 122 was covered with the upper mold member 124 of the mold 120 to be put in a furnace, and the interior of the furnace was caused to be in an atmosphere of nitrogen to decrease the oxygen concentration therein to 4 ppm or less. In this state, the mold 120 was heated to 720° C. by the temperature control of a heater, and then, a molten metal of aluminum having a purity of 99.9%, which was heated to 720° C. and previously measured, was poured into the mold 120 from the injecting nozzle mounted on the inlet of the mold 120 while being pressurized at 10 kPa by nitrogen gas to remove oxide films on the surface of the molten metal. Thus, the molten metal was filled in a space having a size of 115 mm×50 mm×5 mm defined by the flat plate forming portion 122a and the flat plate forming portion 124a (having a depth of 0.4 mm) in the mold 120, and in the metal plate forming portion 122d having a size of 88 mm×38 mm×0.4 mm via the molten metal passage formed in the lower mold member 122. Thereafter, nitrogen gas was blown into the inlet from the injecting nozzle to cool and solidify the molten metal in the mold 120 while pressurizing the molten metal at 10 kPa. Thus, by a so-called molten metal bonding method, there was produced a heat radiating plate wherein the reinforcing member 112 passed through the flat plate, portion 110a in a region, in which one major surface of the reinforcing member 112 (the major surface on the side of the columnar protruding portions 110b) was spaced from one major surface of the flat plate portion 110a (the major surface on the side of the columnar protruding portions 110b) by 0.4 mm, the reinforcing member 112 being bonded directly to the flat plate portion 110a, both end portions of the reinforcing member 112 protruding from the side faces of the flat plate portion 110a, wherein 128 columnar protruding portions 110b were arranged on one major surface of the flat plate portion 110a at intervals (pitches) of 5 mm, each of the columnar protruding portions 110b having a shape of substantially circular truncated cone which had a root diameter (a diameter of a bottom face) of 4 mm, a height of 8 mm and a tapered angle of 2° (the total surface area of the columnar protruding portions 110b being 7628 mm$^2$), and wherein one major surface of the ceramic substrate 114 was bonded directly to the other major surface of the flat plate portion 110a, and the metal plate 116 was bonded directly to the other major surface of the ceramic substrate 114. After the heat radiating plate was ejected from the mold 120, the both end portions of the reinforcing members 112 in longitudinal directions thereof, the end portions protruding from the flat plate portion 110a, were removed (by dividing the both end portions by hand along break lines previously formed by laser processing) to produce a heat radiating plate 110 having a similar shape to that shown in FIGS. 3A and 3B.

Furthermore, when the heat radiating plate was ejected from the mold 120, after the lower mold member 122 was detached, the upper mold member 124 was fixed to a mold releasing apparatus, and a steel plate was arranged on the upper mold member 124 so as to contact thereto. Then, the steel plate was knocked by a knocker (for quantitatively making shocks on the mold to release the heat radiating plate from the mold) to evaluate the releasability of the heat radiating plate from the mold by the number of shocks until release, and the surfaces of the heat radiating plate and the mold were observed. As a result, it was possible to release the heat radiating plate from the mold by two shocks. There was no problem in the shapes of the flat plate portion and column protruding portions of the heat radiating plate, and the mold was not damaged.

EXAMPLES 2-4

There was produced a heat radiating plate 110 by the same method as that in Example 1, except that the columnar protruding portions 110b had a height of 5 mm, a tapered angle of 5° and a total surface area of 5018 mm$^2$ in Example 2, that the columnar protruding portions 110b had a height of 5 mm, a tapered angle of 3° and a total surface area of 5235 mm$^2$ in Example 3, and that the columnar protruding portions 110b had a height of 5 mm and a total surface area of 5364 mm$^2$ in Example 4. Then, by the same method as that in Example 1, the releasability of the heat radiating plate was evaluated, and the surfaces of the heat radiating plate and the mold were observed. As a result, it was possible to release the heat radiating plate from the mold by no shock (Example 2), one shock (Example 3) and two shocks (Example 4), respectively. In Examples 2 through 4, there was no problem in the shapes of the flat plate portion and column protruding portions of the heat radiating plate, and the mold was not damaged.

EXAMPLES 5-8

There was produced a heat radiating plate 110 by the same method as that in Example 1, except that the columnar protruding portions 110b had a root diameter of 2 mm and a height of 4 mm, and were arranged at intervals (pitches) of 3 mm, the number of the columnar protruding portions 110b being 363 so that the columnar protruding portions 110b had a total surface area of 5405 mm$^2$ in Example 5, that the columnar protruding portions 110b had a tapered angle of 3° and a total surface area of 7447 mm$^2$ in Example 6, that the columnar protruding portions 110b had a root diameter of 2 mm, a height of 4 mm and a tapered angle of 5°, and were arranged at intervals (pitches) of 3 mm, the number of the columnar protruding portions 110b being 363 so that the columnar protruding portions 110b had a total surface area of 5065 mm$^2$ in Example 7, that the columnar protruding portions 110b had a root diameter of 2 mm, a height of 4 mm and a tapered angle of 3°, and were arranged at intervals (pitches) of 3 mm, the number of the columnar protruding portions 110b being 363 so that the columnar protruding portions 110b had a total surface area of 5285 mm$^2$ in Example 8. Then, by the same method as that in Example 1, the releasability of the heat radiating plate was evaluated, and the surfaces of the heat radiating plate and the mold were observed. As a result, it was possible to release the heat radiating plate from the mold by no shock (Example 5), one shock (Example 6), one shock (Example 7) and no shock (Example 8), respectively. In Examples 5 through 8, there was no problem in the shapes of the flat plate portion and column protruding portions of the heat radiating plate, and the mold was not damaged.

EXAMPLE 9

In order to produce a heat radiating plate having a similar shape to that shown in FIGS. 5A and 5B, there was used a mold of carbon having a similar shape to that of the mold 120 shown in FIGS. 4A through 4D, except that three ceramic substrate housing portions 122c were arranged at intervals of 1 mm and that the metal plate forming portion 122d was formed in each of the ceramic substrate housing portions 122c. There were also prepared three ceramic substrates 214 of aluminum nitride having a size of 65 mm×60 mm×0.6 mm, and three reinforcing members 212 of aluminum nitride having a size of 59 mm×110 mm×0.6 mm. Then, the ceramic substrates 214 were arranged in the ceramic substrate housing portions 122c of the lower mold member 122 of the mold 120, and both end portions (having a length of 5 mm) of each of the reinforcing members 212 were arranged in the reinforcing member supporting portions 122b of the lower mold member 122, respectively, so that the reinforcing members 212 are spaced at intervals of 7 mm to substantially face the central portion of each of the ceramic substrates 214, respectively. Thereafter, the lower mold member 122 was covered with the upper mold member 124 of the mold 120 to be put in a furnace, and the interior of the furnace was caused to be in an atmosphere of nitrogen to decrease the oxygen concentration therein to 4 ppm or less. In this state, the mold 120 was heated to 720° C. by the temperature control of a heater, and then, a molten metal of aluminum having a purity of 99.9%, which was heated to 720° C. and previously measured, was poured into the mold 120 from the injecting nozzle mounted on the inlet of the mold 120 while being pressurized at 10 kPa by nitrogen gas to remove oxide films on the surface of the molten metal. Thus, the molten metal was filled in a space having a size of 220 mm×100 mm×4 mm defined by the flat plate forming portion 122a and the flat plate forming portion 124a (having a depth of 0.7 mm) in the mold 120, and in the metal plate forming portions 122d having a size of 62 mm×57 mm×0.4 mm via the molten metal passage formed in the lower mold member 122. Thereafter, nitrogen gas was blown into the inlet from the injecting nozzle to cool and solidify the molten metal in the mold 120 while pressurizing the molten metal at 10 kPa. Thus, by the so-called molten metal bonding method, there was produced a heat radiating plate wherein the reinforcing members 212 passed through the flat plate portion 210a in a region, in which one major surface of each of the reinforcing members 212 (the major surface on the side of the columnar protruding portions 210b) was spaced from one major surface of the flat plate portion 210a (the major surface on the side of the columnar protruding portions 210b) by 0.7 mm, the reinforcing members 212 being bonded directly to the flat plate portion 210a, both end portions of each of the reinforcing members 212 protruding from the side faces of the flat plate portion 210a, wherein 662 columnar protruding portions 210b were arranged in each of regions facing the heating element mounting regions (the regions in which the ceramic substrates 214 were bonded to the flat plate portion 210a) on one major surface of the flat plate portion 210a at intervals of 6 mm, each of the columnar protruding portions 210b having a shape of substantially circular truncated cone which had a root diameter (a diameter of a bottom face) of 2.5 mm, a height of 8 mm and a tapered angle of 2°, and wherein one major surface of each of the ceramic substrates 214 was bonded directly to the other major surface of the flat plate portion 210a, and the metal plate 216 was bonded directly to the other major surface of each of the ceramic substrates 214. After the heat radiating plate was ejected from the mold 120, the both end portions of the reinforcing members 212 in longitudinal directions thereof, the end portions protruding from the flat plate portion 210a, were removed (by dividing the both end portions by hand along break lines previously formed by laser processing) to produce a heat radiating plate 210 having a similar shape to that shown in FIGS. 5A and 5B.

Furthermore, when the heat radiating plate was ejected from the mold 120, after the lower mold member 122 was detached, the upper mold member 124 was fixed to a mold releasing apparatus, and a steel plate was arranged on the upper mold member 124 so as to contact thereto. Then, the steel plate was knocked by a knocker (for quantitatively making shocks on the mold to release the heat radiating plate from the mold) to evaluate the releasability of the heat radiating plate from the mold by the number of shocks until release, and the surfaces of the heat radiating plate and the mold were observed. As a result, it was possible to release the heat radiating plate from the mold by two shocks. There was no problem in the shapes of the flat plate portion and column protruding portions of the heat radiating plate, and the mold was not damaged.

EXAMPLES 10-11

There was produced a heat radiating plate 210 by the same method as that in Example 9, except that the columnar protruding portions 210b had a root diameter of 4 mm and a tapered angle of 5°, and were arranged at intervals of 12.5 mm, the number of the columnar protruding portions 210b being 252 in Example 10, that the columnar protruding portions 210b had a root diameter of 3 mm and a tapered angle of 3.5°, and were arranged at intervals (pitches) of 9 mm, the number of the columnar protruding portions 210b being 544 in Example 11. Then, by the same method as that in Example 9, the releasability of the heat radiating plate was evaluated, and the surfaces of the heat radiating plate and the mold were observed. As a result, it was possible to release the heat radiating plate from the mold by one shock in Examples 10 and 11. In Examples 10 and 11, there was no problem in the shapes of the flat plate portion and column protruding portions of the heat radiating plate, and the mold was not damaged.

COMPARATIVE EXAMPLES 1-2

There was produced a heat radiating plate 110 by the same method as that in Example 1, except that the distance between one major surface of the reinforcing member 112 (the major surface on the side of the columnar protruding portions 110b) and one major surface of the flat plate portion 110a (the major surface on the side of the columnar protruding portions 110b) was 2.7 mm, the columnar protruding portions 110b having a height of 5 mm, a tapered angle 5° and a total surface area of 5018 mm$^2$ in Comparative Example 1 and that the distance between one major surface of the reinforcing member 112 (the major surface on the side of the columnar protruding portions 110b) and one major surface of the flat plate portion 110a (the major surface on the side of the columnar protruding portions 110b) was 1.2 mm, the columnar protruding portions 110b having a height of 5 mm, a tapered angle 5° and a total surface area of 5018 mm$^2$ in Comparative Example 2. Then, by the same method as that in Example 1, the releasability of the heat radiating plate was evaluated, and the surfaces of the heat radiating plate and the mold were observed. As a result, it was not possible to release the heat radiating plate unless 15 shocks (Comparative Example 1) and 8 shocks (Comparative Example 2) were made. In Comparative Examples 1 and 2, flaws and deformations on the columnar protruding portions (radiating fins) of the heat radiating plate were observed. Furthermore, although the mold was not damaged, there is every possibility that the mold may be damaged since the releasability was bad.

COMPARATIVE EXAMPLE 3

There was produced a heat radiating plate 110 by the same method as that in Example 1, except that the distance between one major surface of the reinforcing member 112 (the major surface on the side of the columnar protruding portions 110b) and one major surface of the flat plate portion 110a (the major surface on the side of the columnar protruding portions 110b) was 1.3 mm. Then, by the same method as that in Example 1, it was attempted to evaluate the releasability of the heat radiating plate and to observe the surfaces of the heat radiating plate and the mold. However, since it was not possible to release the heat radiating plate from the mold after 30 shocks were made by the mold releasing apparatus, the heat radiating plate was released from the mold by hand. As a result, the upper mold member 124 was broken (it was not possible to release the heat radiating plate from the mold unless the upper mold member 124 was broken). In addition, flaws and deformations on the columnar protruding portions of the heat radiating plate were observed.

As described above, in Examples 1 through 11, the reinforcing member 112 passing through the flat plate portion 110a of the heat radiating plate 110 from one end face of the flat plate portion 110a in width directions (perpendicular to longitudinal directions) thereof to the other end face thereof to extend in the width directions was arranged in a region (a region close to a highest stress region between the heat radiating plate 110 and the mold 120) which was close to one major surface (a major surface on the side of columnar protruding portions 110*b*) of the flat plate portion 110*a* of the heat radiating plate 110 so that the thermal expansion coefficient of the one major surface (the major surface on the side of the columnar protruding portions 110*b*) approaches that of the mold 120. Therefore, even if the tapered angle of the columnar protruding portions (radiating fins) 110*b* was small (not greater than 5°), the releasability of the heat radiating plate 110 from the mold 120 was good, and it was possible to form good heat radiating fins having excellent dimensional accuracy while it was possible to prevent the mold 120 of carbon from being damaged.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A heat radiating plate which is made of a metal material and which comprises:
    a flat plate portion;
    a plurality of columnar protruding portions which protrude from one surface of the flat plate portion and which are integrated with the flat plate portion, each of the columnar protruding portions having a shape of a cylindrical or circular truncated cone; and
    a plurality of reinforcing members which extend in directions parallel to the one surface of the flat plate portion, the reinforcing members being arranged in the flat plate portion between the one surface and an opposite surface of the flat plate portion, and the reinforcing members being closer to the one surface than the opposite surface of the flat plate portion so as to be closer to the plurality of columnar protruding portions than the opposite surface of the flat plate portion, and said reinforcing members are disposed in a plane parallel to the one surface of the flat plate portion and there is no reinforcement member disposed above or below said reinforcing members relative to said plane.

2. The heat radiating plate as set forth in claim 1, wherein said reinforcing members pass through said flat plate portion to extend therein.

3. The heat radiating plate as set forth in claim 1, wherein said reinforcing members have end faces which are exposed to the outside, and the whole surface of said reinforcing members except for the end faces is bonded directly to said flat plate portion.

4. The heat radiating plate as set forth in claim 1, wherein said reinforcing members are made of a material which has a higher melting point than that of said metal material.

5. The heat radiating plate as set forth in claim 1, wherein said metal material is aluminum or an aluminum alloy.

6. The heat radiating plate as set forth in claim 5, wherein said reinforcing members are made of a metal which contains iron and at least one selected from a group consisting of nickel, cobalt, copper and manganese.

7. The heat radiating plate as set forth in claim 5, wherein said reinforcing members are made of at least one ceramic selected from a group consisting of alumina, aluminum nitride, silicon nitride and silicon carbide.

8. The heat radiating plate as set forth in claim 1, wherein one surface of a ceramic substrate is bonded directly to said opposite surface of said flat plate portion, and a metal plate is bonded directly to another surface of said ceramic substrate.

* * * * *